(12) United States Patent
Zaitsu et al.

(10) Patent No.: US 9,343,150 B2
(45) Date of Patent: May 17, 2016

(54) PROGRAMMABLE LOGIC DEVICE WITH RESISTIVE CHANGE MEMORIES

(71) Applicant: KABUSHIKI KAISHA TOSHIBA, Tokyo (JP)

(72) Inventors: Koichiro Zaitsu, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/610,305

(22) Filed: Jan. 30, 2015

(65) Prior Publication Data

US 2015/0263072 A1    Sep. 17, 2015

(30) Foreign Application Priority Data

Mar. 12, 2014    (JP) ................................. 2014-049230

(51) Int. Cl.
*G11C 13/00* (2006.01)
*H01L 45/00* (2006.01)

(52) U.S. Cl.
CPC ........ *G11C 13/0069* (2013.01); *G11C 13/0007* (2013.01); *G11C 2013/0071* (2013.01); *H01L 45/04* (2013.01); *H01L 45/145* (2013.01); *H01L 45/146* (2013.01); *H01L 45/148* (2013.01)

(58) Field of Classification Search
CPC ............. G11C 13/011; G11C 13/0069; G11C 2013/0073; G11C 2013/0078; G11C 2013/009; H01L 145/146
See application file for complete search history.

(56) References Cited

U.S. PATENT DOCUMENTS

| 8,331,130 B2 | 12/2012 | Yasuda et al. | |
|---|---|---|---|
| 2007/0146012 A1 | 6/2007 | Murphy et al. | |
| 2010/0067289 A1 | 3/2010 | Fuji | |
| 2011/0002157 A1 | 1/2011 | Shimomura et al. | |
| 2011/0205780 A1 | 8/2011 | Yasuda et al. | |
| 2012/0044749 A1* | 2/2012 | Muraoka ............ | G11C 13/0007 365/148 |
| 2012/0075910 A1* | 3/2012 | Yasuda ............... | G11C 13/0004 365/148 |

FOREIGN PATENT DOCUMENTS

| JP | 2009-170006 | 7/2009 |
|---|---|---|
| JP | 2010-67332 | 3/2010 |
| JP | 2011-172084 | 9/2011 |

* cited by examiner

*Primary Examiner* — Harry W Byrne
*Assistant Examiner* — Lance Reidlinger
(74) *Attorney, Agent, or Firm* — Finnegan, Henderson, Farabow, Garrett & Dunner LLP

(57) ABSTRACT

A programmable logic device includes: a first memory element including a first electrode connected to a first wiring line, a second electrode, and a first resistive change layer, a resistance between the first and second electrodes being changed from a low-resistance state to a high-resistance state by applying, to the second electrode, a voltage higher than a voltage applied to the first electrode; a second memory element including a third electrode connected to the second electrode, a fourth electrode connected to a second wiring line, and a second resistive change layer, a resistance between the third and fourth electrodes being changed from a low-resistance state to a high-resistance state by applying, to the fourth electrode, a voltage higher than a voltage applied to the third electrode; and a first transistor, of which a gate is connected to the second electrode and the third electrode.

14 Claims, 8 Drawing Sheets

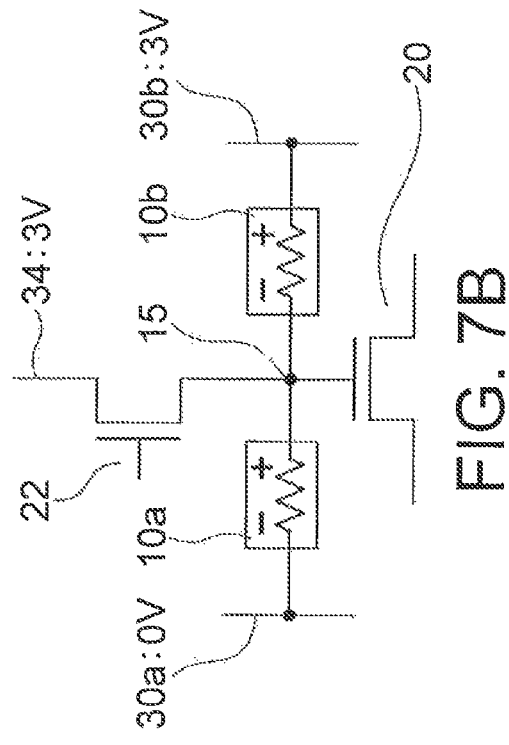
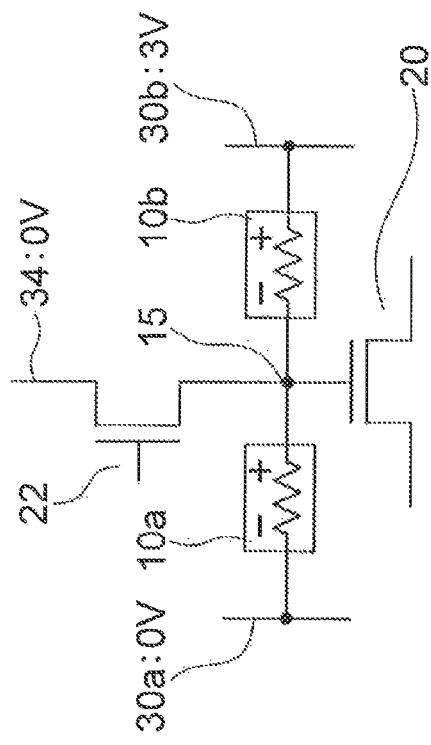
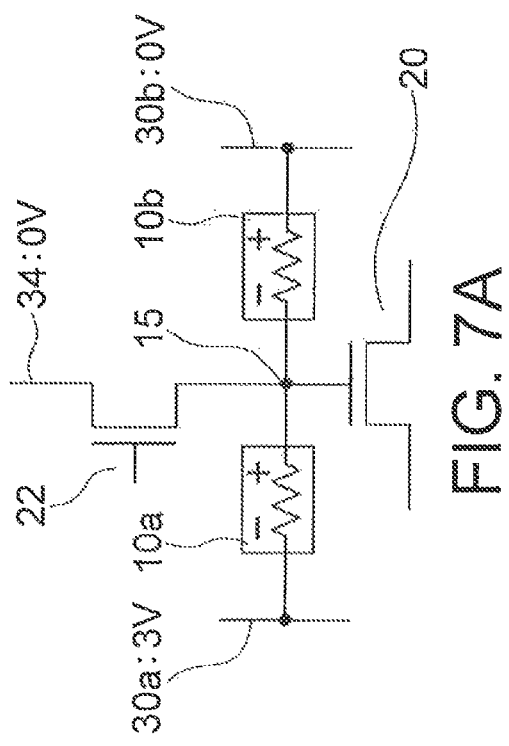
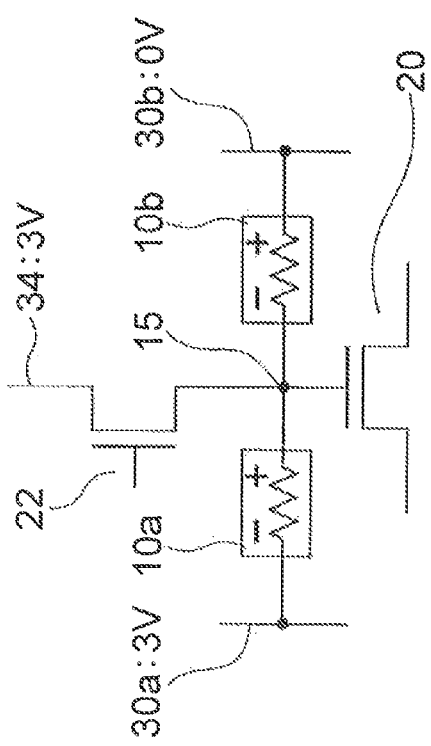

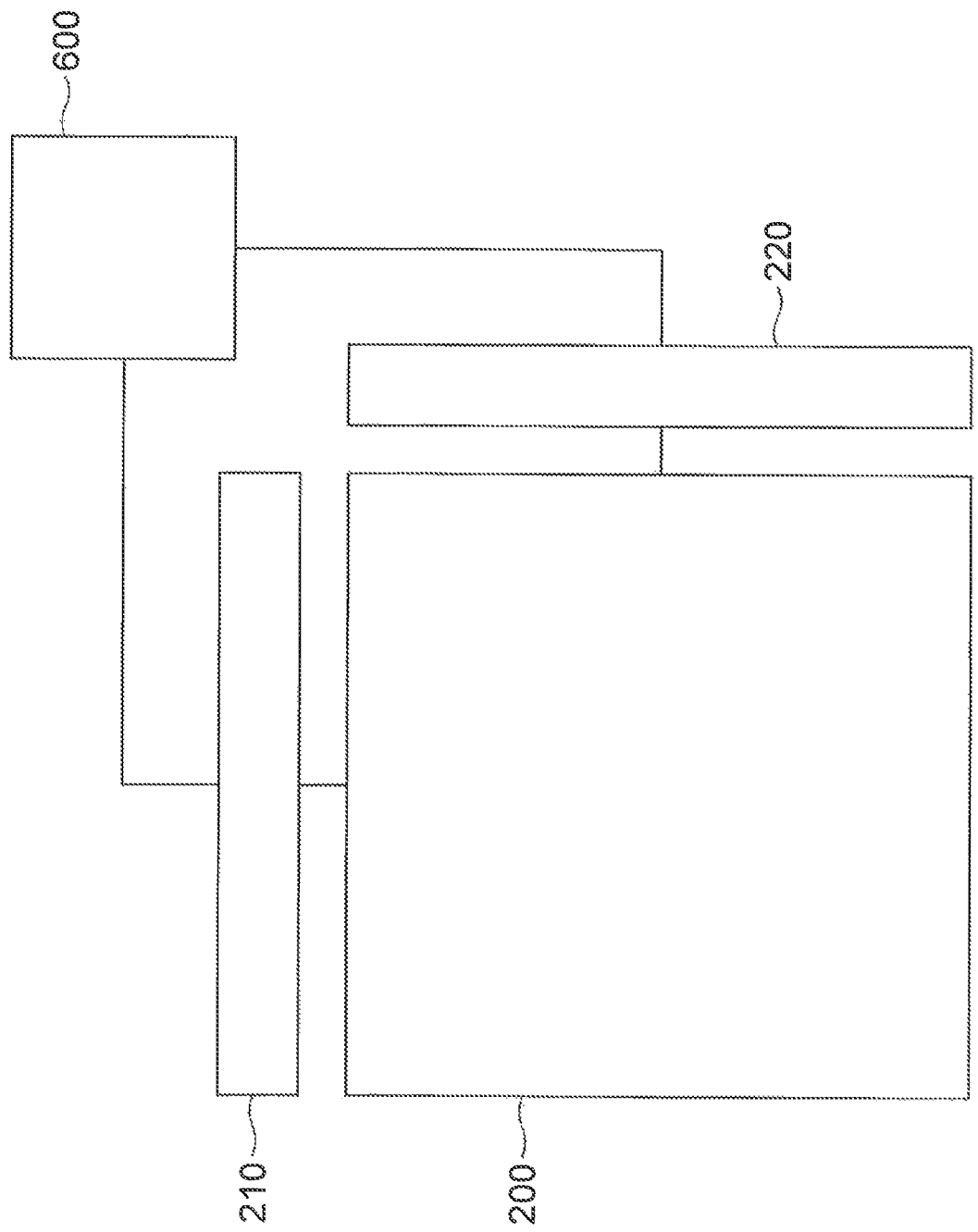

PROGRAMMABLE LOGIC DEVICE WITH RESISTIVE CHANGE MEMORIES

CROSS REFERENCE TO RELATED APPLICATIONS

This application is based upon and claims the benefit of priority from prior Japanese Patent Application No. 2014-049230 filed on Mar. 12, 2014 in Japan, the entire contents of which are incorporated herein by reference.

FIELD

Embodiments described herein relate generally to programmable logic devices.

BACKGROUND

Programmable logic devices are semiconductor integrated circuits capable of reconfiguring circuits after chip manufacture. A programmable logic device includes a plurality of wiring lines, of which two selected wiring lines are electrically connected or disconnected. Some methods are present to control the connection or disconnection of the two selected wiring lines.

One method uses transistors and memories. The memories are electrically programmable, and the transistors are turned on or off based on the data stored in the memories. Two-terminal resistive change memories are known as the aforementioned memories. Each resistive change memory includes two electrodes and a resistive change layer disposed between the two electrodes. The resistive state of the resistive change memory is changed by applying a predetermined voltage between the two electrodes, thereby switching the resistance between the two electrodes from one of a low-resistance state and a high-resistance state to the other.

Such known programmable logic devices using resistive change memories have the following problem. When a programmable logic device is in operation, a power supply voltage (for example 1.5 V) is applied between the electrodes of the resistive change memory. If the power supply voltage is higher than the voltage at which the resistive state of the resistive change memory is switched, the data stored in the resistive change memory may be rewritten by the application of the power supply voltage. This may cause a malfunction of the circuit.

BRIEF DESCRIPTION OF THE DRAWINGS

FIGS. 7A to 7D are diagrams showing examples of programming conditions of a bipolar memory element.

FIG. 9 is a block diagram showing a programmable logic device according to a second embodiment.

DETAILED DESCRIPTION

A programmable logic device according to an embodiment includes: a first memory element including a first electrode connected to a first wiring line, a second electrode, and a first resistive change layer disposed between the first electrode and the second electrode, a resistance between the first electrode and the second electrode being changed from a low-resistance state to a high-resistance state by applying, to the second electrode, a voltage that is higher than a voltage applied to the first electrode; a second memory element including a third electrode connected to the second electrode, a fourth electrode connected to a second wiring line, and a second resistive change layer disposed between the third electrode and the fourth electrode, a resistance between the third electrode and the fourth electrode being changed from a low-resistance state to a high-resistance state by applying, to the fourth electrode, a voltage that is higher than a voltage applied to the third electrode; and a first transistor, of which a gate is connected to the second electrode and the third electrode.

Embodiments will now be explained with reference to the accompanying drawings.

Before the embodiments are explained, resistive change memory elements used in the embodiments will be described.

Figure 1:
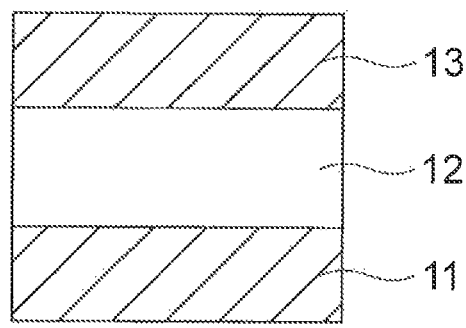
FIG. 1 is a cross-sectional view showing a resistive change memory element.

FIG. 1 is a diagram showing an example of a structure of a resistive change memory element (hereinafter simply referred to as the "memory element"). The memory element 10 includes an electrode 11, a resistive change layer 12, and an electrode 13. The resistive change layer 12 is formed of, for example, a metal oxide or semiconductor oxide such as titanium oxide, hafnium oxide, tantalum oxide, aluminum oxide, or silicon oxide. A semiconductor material such as amorphous silicon, or a multilayer film having a stacked structure including layers of materials selected from metal oxides, semiconductor oxides, and semiconductor materials, may be used to form the resistive change layer 12.

The resistance between the electrodes 11, 13 can be changed by applying a predetermined voltage therebetween. Herein, to change resistance of the memory element 10 from a high-resistance state to a low-resistance state is called "set," and to change resistance from the low-resistance state to the high-resistance state is called "reset." The voltage required for setting the memory element 10 is called "set voltage," and the voltage required for resetting the memory element is called "reset voltage."

The memory element 10 may be either a unipolar memory element or a bipolar memory element. The set voltage and the reset voltage of a unipolar memory element have the same polarity. For example, if a voltage applied to the electrode 11 is higher than a voltage applied to the electrode 13 in setting the memory element 10, a voltage applied to the electrode 11 is also higher than a voltage applied to the electrode 13 in resetting the memory element 10.

In contrast, the set voltage and the reset voltage of a bipolar memory element have opposite polarities. For example, if a voltage applied to the electrode 11 is higher than a voltage applied to the electrode 13 in setting the memory element, a voltage applied to the electrode 11 is lower than a voltage applied to the electrode 13 in resetting the memory element.

Whether a memory element is a unipolar memory element or a bipolar memory element is determined by materials of the electrodes and the resistive change layer, and the voltage conditions in the forming, i.e., the voltage conditions for activating the memory function by applying a predetermined voltage between the electrodes of the memory element after manufacture. Similarly, the polarities of the set voltage and the reset voltage are determined by the materials of the electrodes and the resistive change layer, and the voltage conditions in the forming.

Once the type of the memory element and the polarities of the set voltage and the reset voltage are determined, they never change. Accordingly, in order to set or reset the memory element 10 correctly, the electrode 11 and the electrode 13 should be clearly distinguished from each other. Herein, one of the electrode 11 and the electrode 13, to which a higher voltage is applied in resetting the memory element 10, is called "anode," and the other is called "cathode." If the memory element 10 is a bipolar memory element, a higher voltage is applied to the cathode than to the anode in setting the memory element 10. By contrast, if the memory element is a unipolar memory element, a higher voltage is applied to the anode than to the cathode in setting the memory element 10.

First Embodiment

Figure 2:
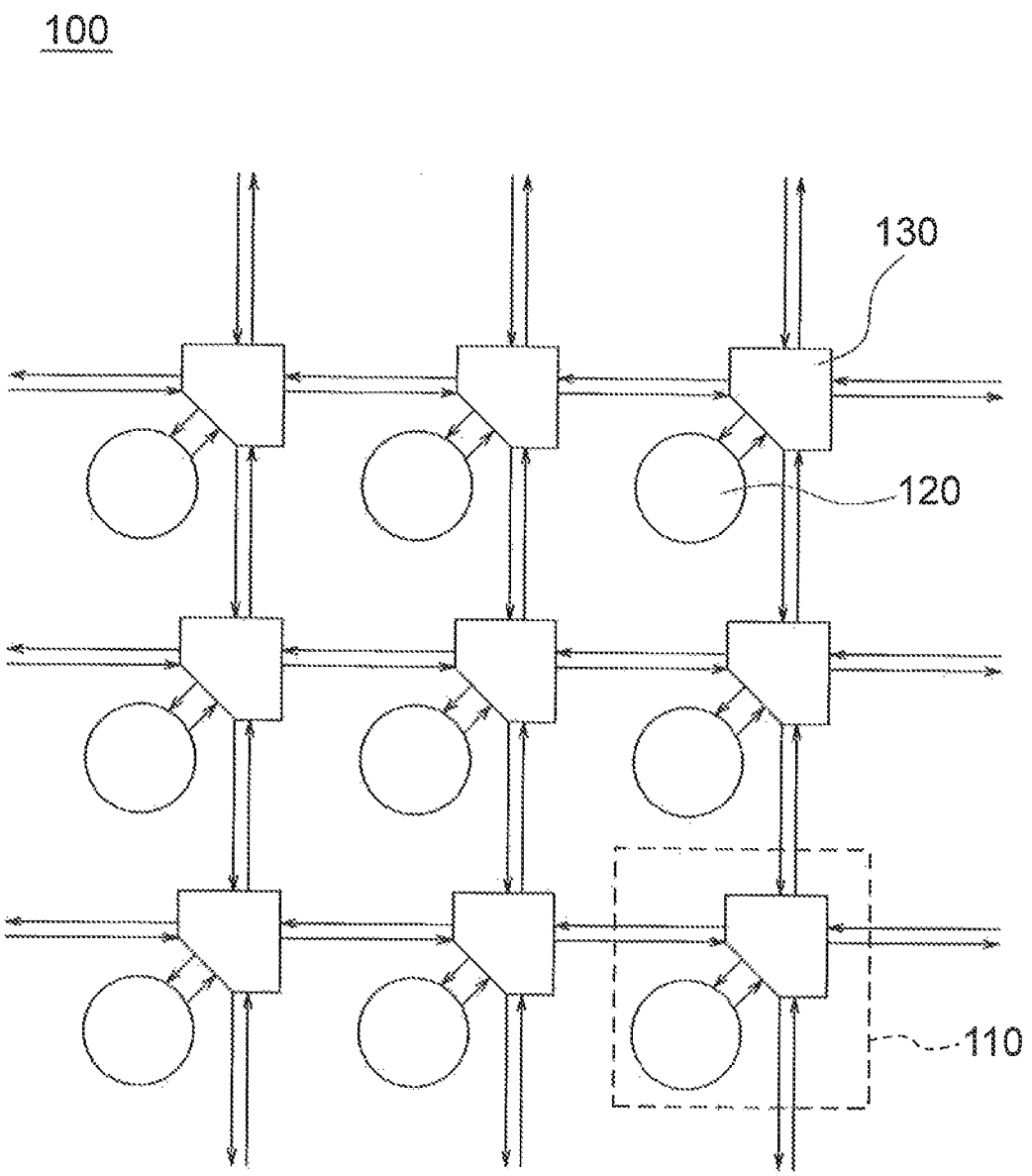
FIG. 2 is a diagram showing a general field programmable gate array (FPGA).

Before a programmable logic device according to a first embodiment is described, the structure of a general field programmable gate array (FPGA), in which the programmable logic device according to the first embodiment is used, will be described. As shown in FIG. 2, an FPGA 100 generally has a plurality of basic blocks 110 arranged in an array. Each basic block 110 is connected to adjacent basic blocks 110 with wiring lines, and includes a logic block 120 and a switch block 130. The logic block 120 performs logical operations basically using a look-up table containing a truth table. Each switch block 130 controls the connection and the disconnection of the wiring lines connecting to adjacent basic blocks 110 so that signals are transmitted to given directions. Each switch block 130 also connects to the logic block 120 included in the relevant basic block 110 including the switch block 130. The logic block 120 and the switch block 130 are capable of controlling the connection based on data stored in the programmable logic device, which is a configuration memory.

Figure 3:
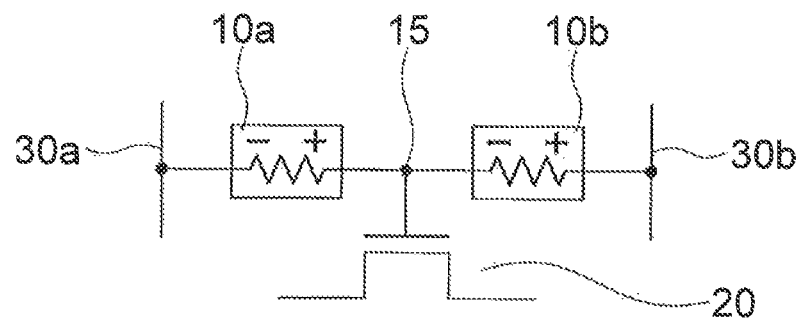
FIG. 3 is a circuit diagram showing an example of memory cell of a programmable logic device according to a first embodiment.

The programmable logic device according to the first embodiment will be described with reference to FIG. 3. The programmable logic device according to the first embodiment includes at least one memory cell, which is shown in FIG. 3. A transistor of the memory cell is turned on or off depending on data stored in memory elements. The memory cell according to the first embodiment includes two memory elements 10a, 10b each having the structure shown in FIG. 1, and one transistor 20. The transistor 20 in this case is an n-channel transistor. In the memory elements shown in FIG. 3 and the following diagrams, the terminal (electrode) denoted by "+" indicates the anode, and the terminal (electrode) denoted by "−" indicates the cathode. The anode of the memory element 10a is connected to the cathode of the memory element 10b, and the gate of the transistor 20 is connected to a junction point (wiring line) 15 between the anode of the memory element 10a and the cathode of the memory element 10b. The cathode of the memory element 10a is connected to a wiring line 30a, and the anode of the memory element 10b is connected to a wiring line 30b.

Figure 4:
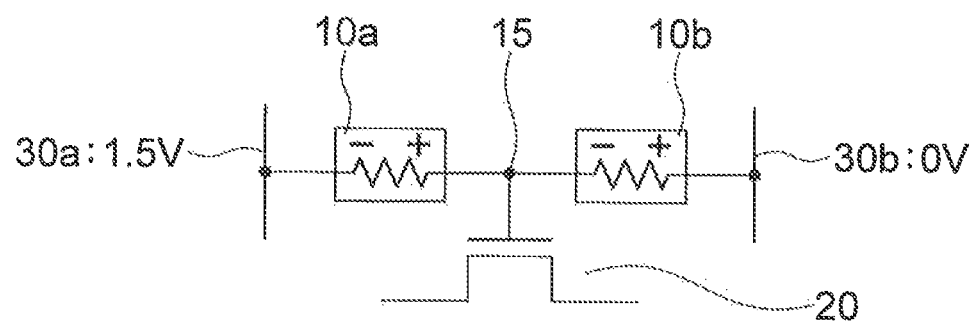
FIG. 4 is an explanatory diagram illustrating voltage conditions for operating the memory cell shown in FIG. 3.

FIG. 4 shows voltage conditions for operating the memory cell according to the first embodiment shown in FIG. 3. A first operating voltage (for example 1.5 V) is applied to the wiring line 30a, and a second operating voltage (for example 0 V) that is lower than the first operating voltage is applied to the wiring line 30b. The memory element 10a and the memory element 10b are programmed to have opposite states. If the memory element 10a is in a low-resistance state and the memory element 10b is in a high-resistance state, for example, the first operating voltage is applied to the gate of the transistor 20 via the memory element 10a. This turns on the transistor 20. On the contrary, if the memory element 10a is in a high-resistance state and the memory element 10b is in a low-resistance state, the second operating voltage is applied to the gate of the transistor 20 via the memory element 10b. This turns off the transistor 20. Under the voltage conditions shown in FIG. 4, the potential of the cathode becomes higher than the potential of the anode in each of the memory elements 10a, 10b.

Here we consider the problem that data stored in the memory element may be rewritten by the application of the aforementioned first and the second operating voltages. If the data stored in the memory is rewritten by applying these operation voltages, the circuit including the programmable logic device may not function properly. Generally, the reset voltage in memory elements is lower than the set voltage. Furthermore, the variation in voltage is greater in the reset voltage than in the set voltage. Accordingly, the probability that a memory element may be erroneously reset by the operating voltages is greater than the probability that it may be erroneously set.

In this embodiment, the anode of one of the memory elements 10a, 10b, for example the memory element 10a, is connected to the cathode of the other, for example the memory element 10b, as shown in FIG. 3. Accordingly, the potential of the cathode becomes higher than the potential of the anode in each of the memory elements 10a, 10b when it is operating. Since erroneous resetting of a memory element may occur when a voltage applied to the anode is higher than a voltage applied to the cathode, the first embodiment can prevent the erroneous resetting.

In contrast, in the programmable logic device disclosed in JP 5032611, the anodes or the cathodes of the two memory elements are connected to each other. In this case, the potential of the anode is greater than the potential of the cathode in either of the two memory elements when the programmable logic device is operating. Accordingly, there is a possibility that erroneous resetting of the device may occur.

Figure 5:
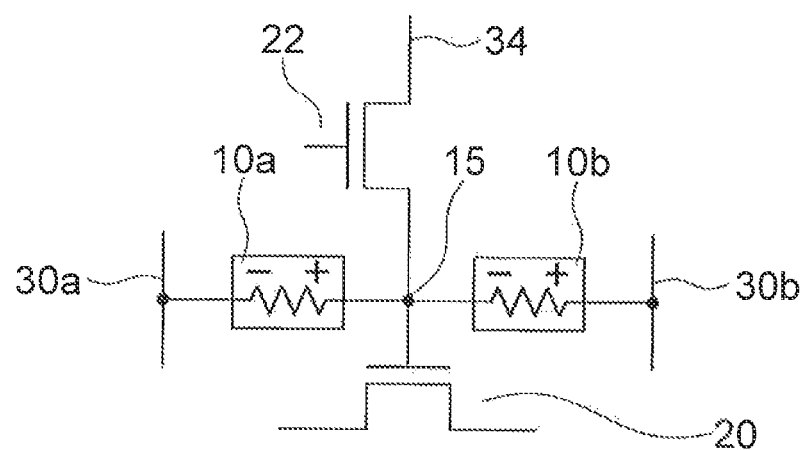
FIG. 5 is a circuit diagram showing another example of memory cell of the programmable logic device according to the first embodiment.

Next, the conditions for programming the memory elements 10a, 10b of the programmable logic device according to the first embodiment will be described. The programmable logic device to be described includes memory cells each further including a transistor 22, the drain of which is connected to the junction point 15 of the memory elements 10a, 10b as shown in FIG. 5. Although the transistor 22 shown in FIG. 5 is an n-channel transistor, a p-channel transistor may be used.

FIGS. 6A to 6D show examples of programming conditions for the memory elements 10a, 10b of unipolar type. As described above, a voltage applied to the anode is higher than a voltage applied to the cathode of a memory element of unipolar type, regardless of whether the memory element is set or reset.

A case will be assumed where the memory elements 10a, 10b are switched from a low-resistance state and a high-resistance state, which are initial states, to a high-resistance state and a low-resistance state, respectively. It is preferable in this case that the memory element 10a be first switched from the low-resistance state to the high-resistance state, and then the memory element 10b be switched from the high-resistance state to the low-resistance state. If the memory element 10b is first switched from the high-resistance state to the low-resistance state, both the memory elements 10a, 10b become to be in the low-resistance state, and a large current may flow between the first wiring line and the second wiring line. In the preferable programming method described above, however, at least one memory element in the high-resistance state is present between the first wiring line and the second wiring line, which prevents a large current from flowing between these wiring lines. Similarly, if the memory elements 10a, 10b are switched from a high-resistance state and a low-resistance state, which are initial states, to a low-resistance state and a high-resistance state, respectively, it is preferable that the memory element 10b be first switched from the low-resistance state to the high-resistance state, and then the memory element 10a be switched from the high-resistance state to the low-resistance state.

Figure 6A:
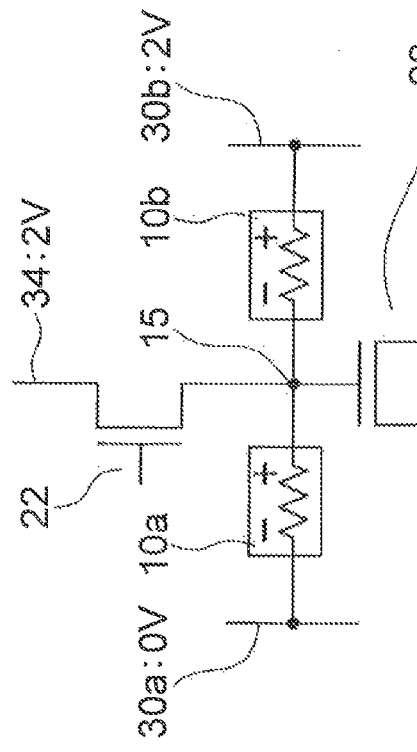
FIGS. 6A to 6D are diagrams showing examples of programming conditions of a unipolar memory element.

FIG. 6A shows an example of voltage conditions for setting the memory element 10a when both the memory elements 10a, 10b are in the high-resistance state. A first voltage (for example 0 V) is applied to the wiring line 30a, a second voltage (for example 3 V) that is higher than the first voltage is applied to the wiring line 34, and a voltage that is higher than the second voltage is applied to the gate of the transistor 22 to turn on the transistor 22. If the transistor 22 is a p-channel transistor, a voltage that is lower than the second voltage is applied to the gate of the transistor 22. As a result, the memory element 10a is switched to the low-resistance state. After the transistor 22 is turned on, a voltage that is not higher than the second voltage may be applied to the wiring line 30b, or the wiring line 30b may be brought into the floating state. It is preferable, however, that a voltage that is the same as the second voltage be applied to the wiring line 30b. The memory element 10b is kept in the high-resistance state in this manner.

Figure 6B:
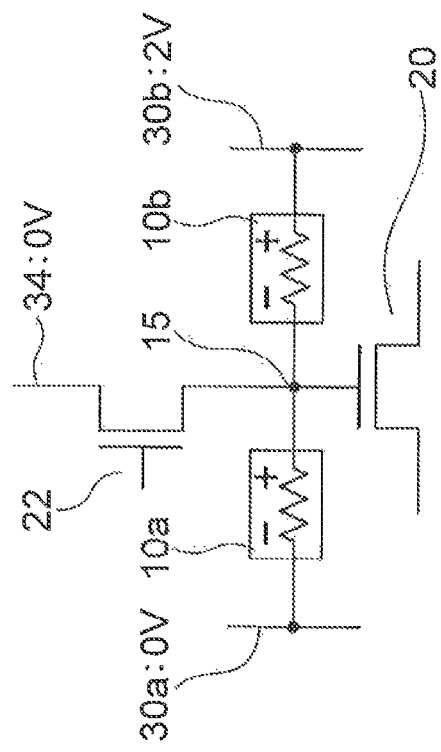

FIG. 6B shows an example of voltage conditions for resetting the memory element 10a when the memory elements 10a, 10b are in the low-resistance state and the high-resistance state, respectively. A third voltage (for example 0 V) is applied to the wiring line 30a, a fourth voltage (for example 2 V) that is higher than the third voltage is applied to the wiring line 34, and a voltage that is higher than the fourth voltage is applied to the gate of the transistor 22 to turn on the transistor 22. If the transistor 22 is a p-channel transistor, a voltage that is lower than the fourth voltage is applied to the gate of the transistor 22. As a result, the memory element 10a is switched to the high-resistance state. After the transistor 22 is turned on, a voltage that is not higher than the fourth voltage may be applied to the wiring line 30b, or the wiring line 30b may be brought into the floating state. It is preferable, however, that a voltage that is the same as the fourth voltage be applied to the wiring line 30b. The memory element 10b is kept in the high-resistance state in this manner.

Figure 6C:
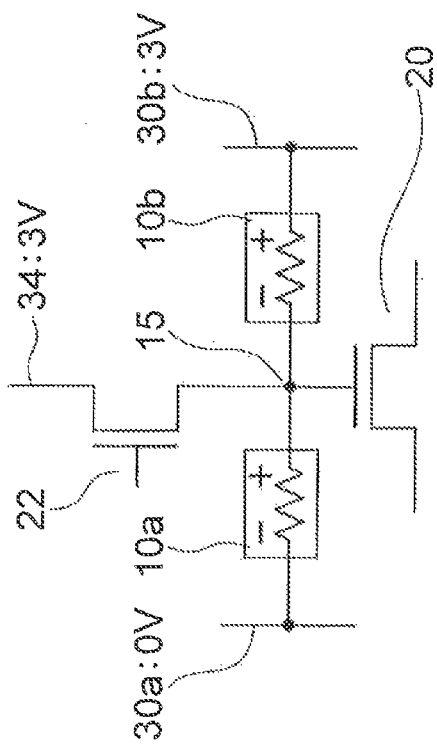

FIG. 6C shows an example of voltage conditions for setting the memory element 10b when both the memory elements 10a, 10b are in the high-resistance state. A first voltage (for example 0 V) is applied to the wiring line 34, a second voltage (for example 3 V) that is higher than the first voltage is applied to the wiring line 30b, and a voltage that is higher than the first voltage is applied to the gate of the transistor 22 to turn on the transistor 22. If the transistor 22 is a p-channel transistor, a voltage that is lower than the first voltage is applied to the gate of the transistor 22. As a result, the memory element 10b is switched to the low-resistance state. After the transistor 22 is turned on, a voltage that is not lower than the first voltage may be applied to the wiring line 30a, or the wiring line 30a may be brought into the floating state. It is preferable, however, that a voltage that is the same as the first voltage be applied to the wiring line 30a. The memory element 10a is kept in the high-resistance state in this manner.

Figure 6D:
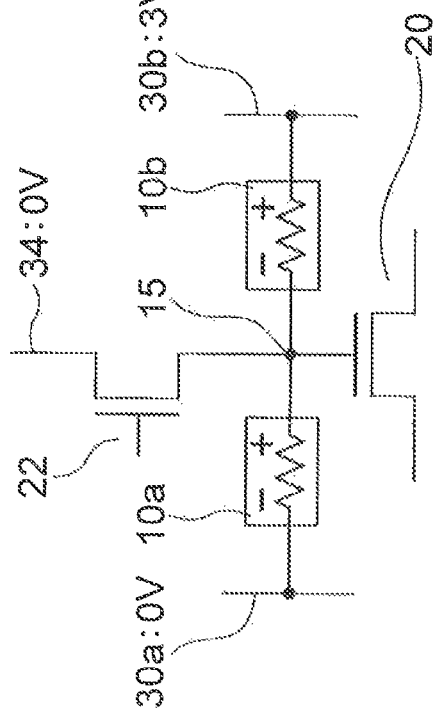

FIG. 6D shows an example of voltage conditions for resetting the memory element 10b when the memory elements 10a, 10b are in the high-resistance state and the low-resistance state, respectively. A third voltage (for example 0 V) is applied to the wiring line 34, a fourth voltage (for example 2 V) that is higher than the third voltage is applied to wiring line 30b, and a voltage that is higher than the third voltage is applied to the gate of the transistor 22 to turn on the transistor 22. If the transistor 22 is a p-channel transistor, a voltage that is lower than the third voltage is applied to the gate of the transistor 22. As a result, the memory element 10b is switched to the high-resistance state. After the transistor 22 is turned on, a voltage that is not lower than the third voltage may be applied to the wiring line 30a, or the wiring line 30a may be brought into the floating state. It is preferable, however, that a voltage that is the same as the third voltage be applied to the wiring line 30a. The memory element 10a is kept in the high-resistance state in this manner.

In the aforementioned programming conditions, the potential of the wiring line 15 is controlled to be at a predetermined value by applying a voltage to the wiring line 34, and turning on the transistor 22. If the transistor 22 is turned off, the wiring line 15 is brought into the floating state. If a voltage is applied to the wiring line 30a or the wiring line 30b when the transistor 22 is in the off state, the potential difference between the anode and cathode in the memory elements 10a and 10b cannot be accurately controlled. As a result, incorrect programming may be performed. For example, it is assumed that both the memory elements 10a, 10b are in the high-resistance state, and the memory element 10a is to be set as shown in FIG. 6A. If a first voltage (for example 0 V) is applied to the wiring line 30a and a second voltage (for example 3 V) is applied to the wiring line 30b when the transistor 22 is in the off state and the wiring line 15 is in the floating state, the potential of the wiring line 15 is determined by the ratio between the resistance of the memory element 10a and the resistance of the memory element 10b. Accordingly, if the resistance of the memory element 10b is higher than the resistance of the memory element 10a due to the influence of variations in the characteristics of the memory elements 10a, 10b, the potential of the wiring line 15 may become substantially the same as that of the wiring line 30a. This may cause erroneous setting of the memory element 10b.

In order to prevent the erroneous programming, it is effective to apply a voltage to the wiring line 34 and to turn on the transistor 22 before a voltage is applied to the wiring line 30a or wiring line 30b. This can be said for any of the programming conditions shown in FIG. 6A to FIG. 6D.

If the memory elements 10a, 10b are of unipolar type, the reset voltage is often lower than the set voltage. As a result, the fourth voltage becomes lower than the second voltage.

FIGS. 7A to 7D show programming conditions for memory elements of bipolar type. As described above, in order to set a memory element of bipolar type, a voltage to be applied to the cathode is higher than a voltage to be applied to the anode, and in order to reset the memory element, a voltage to be applied to the anode is higher than a voltage to be applied to the cathode.

Also in this case, if the memory elements 10a, 10b are switched from a low-resistance state and a high-resistance state, which are initial states, to a high-resistance state and a low-resistance state, respectively, it is preferable that the memory element 10a be first switched from the low-resistance state to the high-resistance state, and then the memory element 10b be switched from the high-resistance state to the low-resistance state. Similarly, if the memory elements 10a, 10b are switched from a high-resistance state and a low-resistance state to a low-resistance state and a high-resistance state, respectively, it is preferable that the memory element 10b be first switched from the low-resistance state to the high-resistance state, and then the memory element 10a be switched from the high-resistance state to the low-resistance state.

FIG. 7A shows an example of voltage conditions for setting the memory element 10a when both the memory elements 10a, 10b are in the high-resistance state. A fifth voltage (for example 0 V) is applied to the wiring line 34, a sixth voltage (for example 3 V) that is higher than the fifth voltage is applied to the wiring line 30a, and a voltage that is higher than the fifth voltage is applied to the gate of the transistor 22 to turn on the transistor 22. If the transistor 22 is a p-channel transistor, a voltage that is lower than the fifth voltage is applied to the gate of the transistor 22. As a result, the memory element 10a is switched to the low-resistance state. After the transistor 22 is turned on, a voltage that is not lower than the fifth voltage may be applied to the wiring line 30b, or the wiring line 30b may be brought into the floating state. It is preferable, however, that a voltage that is the same as the fifth voltage be applied to the wiring line 30b. The memory element 10b is kept in the high-resistance state in this manner.

FIG. 7B shows an example of voltage conditions for resetting the memory element 10a when the memory elements 10a, 10b are in the low-resistance state and the high-resistance state, respectively. A seventh voltage (for example 0 V) is applied to the wiring line 30a, an eighth voltage (for example 3 V) that is higher than the seventh voltage is applied to the wiring line 34, and a voltage that is higher than the eighth voltage is applied to the gate of the transistor 22 to turn on the transistor 22. If the transistor 22 is a p-channel transistor, a voltage that is lower than the eighth voltage is applied to the gate of the transistor 22. As a result, the memory element 10a is switched to the high-resistance state. After the transistor 22 is turned on, a voltage that is not lower than the eighth voltage may be applied to the wiring line 30b, or the wiring line 30b may be brought into the floating state. It is preferable, however, that a voltage that is the same as the eighth voltage be applied to the wiring line 30b. The memory element 10b is kept in the high-resistance state in this manner.

FIG. 7C shows an example of voltage conditions for setting the memory element 10b when both the memory elements 10a, 10b are in the high-resistance state. A fifth voltage (for example 0 V) is applied to the wiring line 30b, a sixth voltage (for example 3 V) that is higher than the fifth voltage is applied to the wiring line 34, and a voltage that is higher than the sixth voltage is applied to the gate of the transistor 22 to turn on the transistor 22. If the transistor 22 is a p-channel transistor, a voltage that is lower than the sixth voltage is applied to the gate of the transistor 22. As a result, the memory element 10b is switched to the low-resistance state. After the transistor 22 is turned on, a voltage that is not higher than the sixth voltage may be applied to the wiring line 30a, or the wiring line 30a may be brought into the floating state. It is preferable, however, that a voltage that is the same as the sixth voltage be applied to the wiring line 30a. The memory element 10a is kept in the high-resistance state in this manner.

FIG. 7D shows an example of voltage conditions for resetting the memory element 10b when the memory elements 10a, 10b are in the high-resistance state and the low-resistance state, respectively. A seventh voltage (for example 0 V) is applied to the wiring line 34, an eighth voltage (for example 3 V) that is higher than the seventh voltage is applied to the wiring line 30b, and a voltage that is higher than the seventh voltage is applied to the gate of the transistor 22 to turn on the transistor 22. If the transistor 22 is a p-channel transistor, a voltage that is lower than the seventh voltage is applied to the gate of the transistor 22. As a result, the memory element 10b is switched to the high-resistance state. After the transistor 22 is turned on, a voltage that is not higher than the seventh voltage may be applied to the wiring line 30a, or the wiring line 30a may be brought into the floating state. It is preferable, however, that a voltage that is the same as the seventh voltage be applied to the wiring line 30a. The memory element 10a is kept in the high-resistance state in this manner.

Also in the programming conditions shown in FIGS. 7A to 7D, it is effective to apply a voltage to the wiring line 34 and to turn on the transistor 22 before applying a voltage to the wiring line 30a or wiring line 30b. This would prevent programming erroneously a memory element that is not the target memory element.

Figure 8:
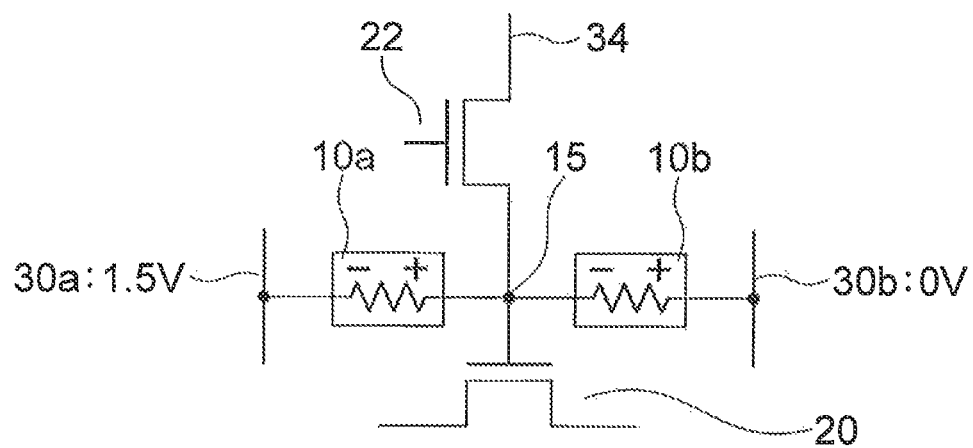
FIG. 8 is an explanatory diagram illustrating voltage conditions for operating the memory cell shown in FIG. 5.

FIG. 8 shows an example of voltage conditions for operating the memory cell shown in FIG. 5. The conditions are the same regardless of whether the memory element is of bipolar type or unipolar type; a first operating voltage (for example 1.5 V) is applied to the wiring line 30a, a second operating voltage (for example 0 V) that is lower than the first operating voltage is applied to the wiring line 30b, and the transistor 22 is turned off.

As described above, whether each of the electrodes 11, 13 is the anode or cathode depends on the materials of the electrodes or the resistive change layer of the memory element. Similarly, the type of the memory element changes when the materials of the electrodes or the resistive change layer are changed. For example, if the resistive change layer 12 is formed of a metal oxide or semiconductor oxide such as titanium oxide, hafnium oxide, tantalum oxide, aluminum oxide, or silicon oxide, the electrode 11 is formed of titanium or titanium nitride, and the electrode 13 is formed of nickel, the memory element becomes a unipolar memory element. The electrode 11 becomes the cathode and the electrode 13 becomes the anode in this case. As a result, the memory element is set when a voltage applied to the electrode 13 is higher than a voltage applied to the electrode 11, and reset when a voltage applied to the electrode 13 is higher than a voltage applied to the electrode 11.

Although the electrode 11 and the electrode 13 are formed of different materials in the above example, they can be formed of the same material. Which of the electrode 11 and the electrode 13 serves the anode, and which serves as the cathode are determined by the voltage conditions in the forming process after the memory element is manufactured.

As described above, according to the first embodiment, it is possible to provide a programmable logic device capable of preventing erroneous rewriting while the memory is in operation.

Second Embodiment

FIG. 9 shows a programmable logic device according to a second embodiment. The programmable logic device according to the second embodiment includes a memory cell array 200 in which memory cells, each being shown in FIG. 5, are arranged in an array form, a selection circuit 210, a selection circuit 220, and a control circuit 600 that controls the selection circuit 210 and the selection circuit 220.

The selection circuit 210 is connected to the wiring lines 30a, 30b of the memory cells in the array to select memory cells arranged in a column.

The selection circuit 220 is connected to the gates of the transistors 22 of the memory cells in the array to select memory cells arranged in a row.

The selection circuit 210 applies a write voltage supplied from the control circuit 600 to the wiring lines 30a, 30b of the selected memory cells, and the selection circuit 220 applies the write voltage to the gates of the transistors 22 of the selected memory cells. Data is written to the memory elements 10a, 10b of a target memory cell in this manner. In a write operation, a write voltage supplied from the control circuit 600 via the selection circuit 210 or the selection circuit 220, or a write voltage supplied from the control circuit 600 via another selection circuit that is not shown may be applied to the wiring line 34.

When the programmable logic device is in operation, the transistor 20 in the selected memory cell is turned on or off based on the data stored in the memory elements 10a, 10b, and the wiring line connected to the source of the transistor 20 and the wiring line connected to the drain of the transistor 20 are connected or disconnected based on the state of the transistor 20.

As in the case of the first embodiment, the programmable logic device according to the second embodiment is capable of preventing erroneous rewriting of the memory during the operation of the device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A programmable logic device comprising:
    a first memory element including a first electrode connected to a first wiring line, a second electrode, and a first resistive change layer disposed between the first electrode and the second electrode, a resistance between the first electrode and the second electrode being changed from a low-resistance state to a high-resistance state by applying, to the second electrode, a first voltage that is higher than a second voltage applied to the first electrode, and a resistance between the first electrode and the second electrode being changed from the high-resistance state to the low-resistance state by applying, to the second electrode, a third voltage that is higher than a fourth voltage applied to the first electrode;
    a second memory element including a third electrode connected to the second electrode, a fourth electrode connected to a second wiring line, and a second resistive change layer disposed between the third electrode and the fourth electrode, a resistance between the third electrode and the fourth electrode being changed from a low-resistance state to a high-resistance state by applying, to the fourth electrode, a fifth voltage that is higher than a sixth voltage applied to the third electrode, and a resistance between the third electrode and the fourth electrode being changed from the high-resistance state to the low-resistance state by applying, to the fourth electrode, a seventh voltage that is higher than an eighth voltage applied to the third electrode;
    a first transistor, of which a gate is connected to the second electrode and the third electrode;
    a second transistor, of which one of a source and a drain is connected to the second electrode and the third electrode, and the other is connected to a third wiring line; and
    a control circuit that switches the first memory element from one of the low-resistance state and the high-resistance state to the other by supplying voltages to the first and third wiring lines, and by supplying a voltage to a gate of the second transistor, and switches the second memory element from one of the low-resistance state and the high-resistance state to the other by supplying voltages to the second and third wiring lines, and by supplying a voltage to the gate of the second transistor.

2. The device according to claim 1, wherein when one of the first memory element and the second memory element is in the low-resistance state, and the other is in the high-resistance state, a state of the first transistor is controlled by applying a ninth voltage to the first wiring line, and applying a tenth voltage that is lower than the ninth voltage to the second wiring line.

3. The device according to claim 1, wherein the control circuit further applies:
    the third voltage to the second wiring line in switching the first memory element from the high-resistance state to the low-resistance state;
    the first voltage to the second wiring line in switching the first memory element from the low-resistance state to the high-resistance state;
    the eighth voltage to the first wiring line in switching the second memory element from the high-resistance state to the low-resistance state; and
    the sixth voltage to the first wiring line in switching the second memory element from the low-resistance state to the high-resistance state.

4. The device according to claim 1, wherein the control circuit switches a resistance state of each of the first memory element and the second memory element by turning on the second transistor, and then applying a voltage to at least one of the first wiring line and the second wiring line.

5. The device according to claim 1, wherein the first electrode and the second electrode are formed of different materials, and the third electrode and the fourth electrode are formed of different materials.

6. The device according to claim 1, wherein the first electrode and the third electrode are formed of an identical material, and the second electrode and the fourth electrode are formed of an identical material.

7. The device according to claim 1, wherein the first resistive change layer and the second resistive change layer contain at least one material selected from the group consisting of silicon oxide, hafnium oxide, aluminum oxide, titanium oxide, and tantalum oxide.

8. The device according to claim 1, wherein the first electrode contains titanium or titanium nitride.

9. The device according to claim 1, wherein the second electrode contains nickel.

10. The device according to claim 1, wherein the first electrode contains titanium or titanium nitride and the second electrode contains nickel.

11. The device according to claim 10, wherein the first resistive change layer and the second resistive change layer contain at least one material selected from the group consisting of silicon oxide, hafnium oxide, aluminum oxide, titanium oxide, and tantalum oxide.

12. The device according to claim 2, wherein the first electrode contains titanium or titanium nitride and the second electrode contains nickel.

13. The device according to claim 12, wherein the first resistive change layer and the second resistive change layer contain at least one material selected from the group consisting of silicon oxide, hafnium oxide, aluminum oxide, titanium oxide, and tantalum oxide.

14. A programmable logic device, comprising:
 a first memory element including a first electrode connected to a first wiring line, a second electrode, and a first resistive change layer disposed between the first electrode and the second electrode, a resistance between the first electrode and the second electrode being changed from a low-resistance state to a high-resistance state by applying, to the second electrode, a first voltage that is higher than a second voltage applied to the first electrode, and a resistance between the first electrode and the second electrode being changed from the high-resistance state to the low-resistance state by applying, to the second electrode, a third voltage that is lower than a fourth voltage applied to the first electrode;
 a second memory element including a third electrode connected to the second electrode, a fourth electrode connected to a second wiring line, and a second resistive change layer disposed between the third electrode and the fourth electrode, a resistance between the third electrode and the fourth electrode being changed from a low-resistance state to a high-resistance state by applying, to the fourth electrode, a fifth voltage that is higher than a sixth voltage applied to the third electrode, and a resistance between the third electrode and the fourth electrode being changed from the high-resistance state to the low-resistance state by applying, to the fourth electrode, a seventh voltage that is lower than an eighth voltage applied to the third electrode;
 a first transistor, of which a gate is connected to the second electrode and the third electrode;
 a second transistor, of which one of a source and a drain is connected to the second electrode and the third electrode, and the other is connected to a third wiring line; and
 a control circuit that switches the first memory element from one of the low-resistance state and the high-resistance state to the other by supplying voltages to the first and third wiring lines, and by supplying a voltage to a gate of the second transistor; and switches the second memory element from one of the low-resistance state and the high-resistance state to the other by supplying voltages to the second and third wiring lines, and by supplying a voltage to the gate of the second transistor,
 wherein the control circuit further applies:
 the third voltage to the second wiring line in switching the first memory element from the high-resistance state to the low-resistance state;
 the first voltage to the second wiring line in switching the first memory element from the low-resistance state to the high-resistance state;
 the eighth voltage to the first wiring line in switching the second memory element from the high-resistance state to the low-resistance state; and
 the sixth voltage to the first wiring line in switching the second memory element from the low-resistance state to the high-resistance state.

* * * * *